(12) United States Patent
Soshino

(10) Patent No.: US 10,788,388 B2
(45) Date of Patent: Sep. 29, 2020

(54) PRESSURE SENSOR

(71) Applicant: Hitachi Automotive Systems, Ltd., Hitachinaka-shi, Ibaraki (JP)

(72) Inventor: Masahiko Soshino, Hitachinaka (JP)

(73) Assignee: Hitachi Automotive Systems, Ltd., Hitachinaka-shi (JP)

(*) Notice: Subject to any disclaimer, the term of this patent is extended or adjusted under 35 U.S.C. 154(b) by 94 days.

(21) Appl. No.: 16/090,891

(22) PCT Filed: Apr. 20, 2017

(86) PCT No.: PCT/JP2017/015838
§ 371 (c)(1),
(2) Date: Oct. 3, 2018

(87) PCT Pub. No.: WO2017/212800
PCT Pub. Date: Dec. 14, 2017

(65) Prior Publication Data
US 2019/0107457 A1 Apr. 11, 2019

(30) Foreign Application Priority Data
Jun. 6, 2016 (JP) ................................. 2016-112806

(51) Int. Cl.
*G01L 19/14* (2006.01)
*G01L 19/06* (2006.01)
(Continued)

(52) U.S. Cl.
CPC .......... *G01L 19/147* (2013.01); *G01L 9/0041* (2013.01); *G01L 19/0069* (2013.01);
(Continued)

(58) Field of Classification Search
CPC ... G01L 19/147; G01L 9/0041; G01L 19/141; G01L 19/0069; G01L 19/0084;
(Continued)

(56) References Cited

U.S. PATENT DOCUMENTS 4,914,954 A   4/1990   Zlamal
5,747,694 A   5/1998   Baba et al.
(Continued)

FOREIGN PATENT DOCUMENTS

JP   9-43076 A    2/1997
JP   11-118639 A  4/1999
(Continued)

OTHER PUBLICATIONS

Translation of JP 2001215159 A (provided by applicant) (Year: 2001).*
(Continued)

*Primary Examiner* — Nathaniel T Woodward
(74) *Attorney, Agent, or Firm* — Crowell & Moring LLP

(57) ABSTRACT

Provided is a pressure sensor that uses a sensor chip as a pressure measurement element and can suppress condensation around the sensor chip of water vapor permeating a protective member from a gas to be measured. The pressure sensor includes a pressure measurement chamber into which a gas to be measured is introduced; a sensor chip that faces the pressure measurement chamber; a sensor support that has a support surface supporting the sensor chip; and a protective member that covers the sensor chip. The pressure sensor also includes a heat insulation chamber that faces a back surface opposite to the support surface of the sensor support; and a gas passage that communicates the heat insulation chamber and the pressure measurement chamber.

6 Claims, 5 Drawing Sheets

(51) Int. Cl.
  *G01L 9/00* (2006.01)
  *G01L 23/24* (2006.01)
  *G01L 19/00* (2006.01)
  *H01L 23/00* (2006.01)

(52) U.S. Cl.
  CPC ...... *G01L 19/0084* (2013.01); *G01L 19/0092* (2013.01); *G01L 19/06* (2013.01); *G01L 19/141* (2013.01); *G01L 23/24* (2013.01); *H01L 24/32* (2013.01); *H01L 24/45* (2013.01); *H01L 24/48* (2013.01); *H01L 2224/32225* (2013.01); *H01L 2224/45124* (2013.01); *H01L 2224/45144* (2013.01); *H01L 2224/48091* (2013.01); *H01L 2224/48227* (2013.01); *H01L 2224/73265* (2013.01); *H01L 2224/85455* (2013.01); *H01L 2924/15153* (2013.01); *H01L 2924/15747* (2013.01)

(58) Field of Classification Search
  CPC ..... G01L 19/0092; G01L 19/06; G01L 23/24; H01L 2224/45144; H01L 24/48; H01L 2224/45124; H01L 2224/32225; H01L 2224/85455; H01L 2224/48227; H01L 2924/15153; H01L 2924/15747; H01L 24/45; H01L 24/32; H01L 2224/48091; H01L 2224/73265
  See application file for complete search history.

(56) References Cited

U.S. PATENT DOCUMENTS 8,028,584 B2 * 10/2011 Otsuka ............... G01L 19/0069
  73/706
2003/0214026 A1 * 11/2003 Tokuhara .......... H01L 23/49861
  257/692
2009/0049921 A1 2/2009 Otsuka et al.

FOREIGN PATENT DOCUMENTS

| JP | 2001-215159 A | | 8/2001 |
| JP | 2001215159 A | * | 8/2001 |
| JP | 2003-337073 A | | 11/2003 |
| JP | 2009-047532 A | | 3/2009 |
| JP | 2010-19663 A | | 1/2010 |

OTHER PUBLICATIONS

International Search Report (PCT/ISA/210) issued in PCT Application No. PCT/JP2017/015838 dated Aug. 8, 2017 with English translation (four (4) pages).
Japanese-language Written Opinion (PCT/ISA/237) issued in PCT Application No. PCT/JP2017/015838 dated Aug. 8, 2017 (five (5) pages).

* cited by examiner

PRESSURE SENSOR

TECHNICAL FIELD

The present invention relates to a pressure sensor.

BACKGROUND

Conventionally an invention relating to a semiconductor pressure sensor used for detection of intake pressure of an internal combustion engine, detection of atmospheric pressure or the like is known (see PTL 1 to be described below). This conventional semiconductor pressure sensor includes a sensor element, a printed circuit board, and a base. The sensor element has a pressure introduction pipe. The printed circuit board supports the sensor element to be spaced with a predetermined interval therebetween. The base holds the printed circuit board and has a pressure passage into which the pressure introduction pipe of the sensor element is inserted. A spacing distance between the sensor element and the printed circuit board is set such that a temperature decrease rate of the sensor element during natural cooling is lower than a temperature decrease rate of the pressure passage in the base (see claim 1 and FIG. 1 and the like of PTL 1).

With this configuration, the sensor element and the pressure introduction pipe are kept at a higher temperature than the pressure passage after the engine stops, the humidity of introduced air, which has been introduced into the pressure passage, the pressure introduction pipe, and a conversion unit that converts the pressure into an electric signal, is condensed first in the pressure passage having a low temperature. As a result, the humidity of the introduced air decreases so that it is possible to prevent condensation and freezing in the pressure introduction pipe and the conversion unit of the sensor element. Therefore, it is possible to obtain an excellent semiconductor pressure sensor which does not cause reduction in accuracy of pressure detection or a malfunction even in a low temperature operation such as restart of the internal combustion engine (see paragraphs 0012 and 0019, and the like of PTL 1).

In addition, pressure sensor in which a pressure detection element is configured as a sensor chip is known (see paragraph 0029, FIG. 1, and the like of PTL 2 to be described below). This conventional pressure sensor has a problem of removing dust, dirt, and the like adhering to an inner portion, and a check valve is separated from a wall surface of a pressure introduction hole when the inside of an object to be measured is under negative pressure so that air flows along a the passing through an outer portion of a port, a through hole, the pressure introduction hole, and an object to be measured (see the same document, abstract or the like).

The semiconductor pressure sensor described in PTL 1 can prevent the condensation in the sensor element, but has a problem that a degree of freedom in design is low so that it is not suitable for miniaturization. On the other hand, the pressure sensor described in PTL 2 can improve a degree of freedom in design as compared to the semiconductor pressure sensor described in PTL 1 by using the sensor chip as the pressure detection element, and thus, is suitable for miniaturization, which is advantageous.

CITATION LIST

Patent Literature

PTL 1: JP 11-118639 A
PTL 2: JP 2010-19663 A

SUMMARY OF INVENTION

Technical Problem

In the pressure sensor described in PTL 2, the sensor chip is provided in a recess of a case, and a bonding wire or the like is coated by filling this recess with a protective member made of fluorine gel, fluorine rubber, or the like so as to prevent corrosion and the like (see paragraphs 0029 to 0031, FIG. 1, and the like of PTL 2). However, there is a risk that water vapor permeating the protective member from a gas to be measured condenses on the periphery of the sensor chip so that the bonding wire and the like is disconnected by electrolytic corrosion, for example, when the case is cooled and a temperature of the protective member covering the sensor chip falls below a temperature of the gas to be measured such as intake air of an internal combustion engine introduced into the port.

The present invention has been made in view of the above problems, and an object thereof is to provide a pressure sensor that uses a sensor chip as a pressure measurement element and can suppress condensation around the sensor chip of water vapor permeating a protective member from a gas to be measured.

Solution to Problem

In order to achieve the above-described object, the pressure sensor of the present invention including a pressure measurement chamber into which a gas to be measured is introduced, a sensor chip which faces the pressure measurement chamber, a sensor support which has a support surface supporting the sensor chip, and a protective member which covers the sensor chip, includes a heat insulation chamber which faces a back surface opposite to the support surface of the sensor support, and a gas passage which communicates with the heat insulation chamber and the pressure measurement chamber.

Advantageous Effects of Invention

In the pressure sensor of the present invention, the pressure of the gas to be measured introduced into the pressure measurement chamber can be measured by the sensor chip facing the pressure measurement chamber. In addition, a fluid to be measured is introduced into both the pressure measurement chamber facing the support surface of the sensor support and the heat insulation chamber facing the back surface of the sensor support via the gas passage communicating between the pressure measurement chamber and the heat insulation chamber, and it is possible to suppress temperature decreases of both the support surface and the back surface of the sensor support.

Therefore, according to the pressure sensor of the present invention, the temperature of the protective member covering the sensor chip supported on the support surface of the sensor support is prevented from lowering to a temperature equal to or lower than a dew point of the gas to be measured, and it is possible to prevent water vapor permeating the protective member from the gas to be measured from being condensed around the sensor chip.

DESCRIPTION OF EMBODIMENTS

Hereinafter, embodiments of a pressure sensor according to the present invention will be described with reference to the drawings.

First Embodiment

Figure 1:
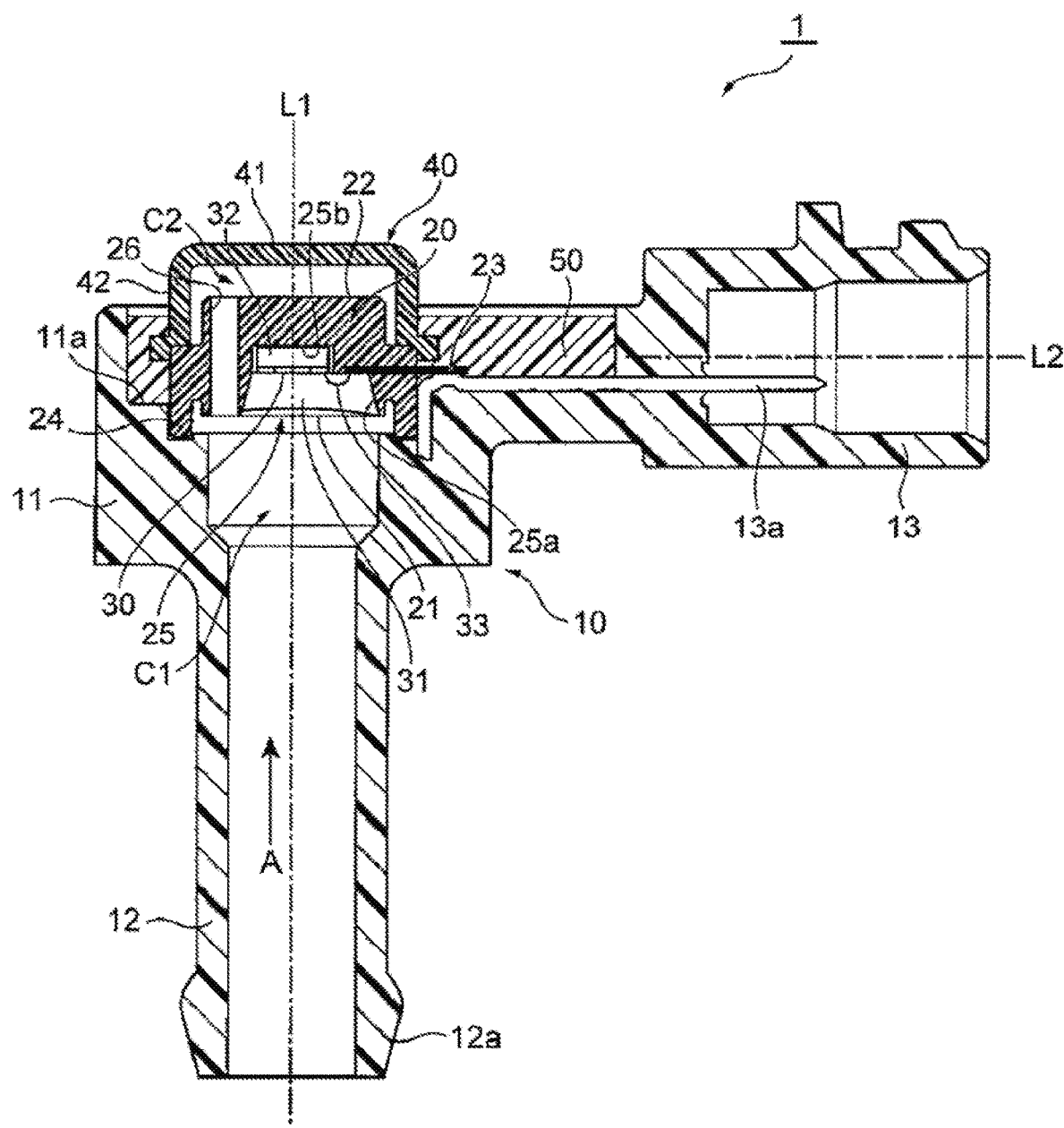
FIG. 1 is a cross-sectional view of a pressure sensor according to a first embodiment of the present invention.

FIG. 1 is a cross-sectional view of a pressure sensor 1 according to a first embodiment of the present invention.

The pressure sensor 1 of the present embodiment can be used, for example, for measurement of intake pressure of an internal combustion engine and measurement of exhaust pressure. For example, the pressure sensor 1 can include: an exterior case 10; a sensor support 20 fixed to the exterior case 10; a sensor chip 30 supported by the sensor support 20; and a cover 40 covering the sensor support 20.

For example, the exterior case 10 is manufactured by molding with a mold using a thermosetting resin such as an epoxy resin or a thermoplastic resin such as a polybutylene terephthalate (PBT) resin and a polyphenylene sulfide (PPS) resin as a material. For example, the exterior case 10 includes: a main body 11 which supports the sensor support 20; a pressure introduction pipe 12 which introduces a gas A to be measured into the main body 11; and a connector portion 13 connected to the main body 11.

The main body 11 of the exterior case 10 is formed in a cylindrical shape having openings at both ends in a direction of an axis L1, for example. In the main body 11, the opening at one end in the direction of the axis L1 is connected to the pressure introduction pipe 12, and a pressure measurement chamber C1 is defined inside the opening. The pressure measurement chamber C1 faces the support surface 21 of the sensor support 20 supporting the sensor chip 30, and the gas A to be measured is introduced through the pressure introduction pipe 12.

The main body 11 has a recess 11a, configured to dispose the sensor support 20 and the cover 40, around the opening at an end on the opposite side of the end to which the pressure introduction pipe 12 is connected in the direction of the axis L1. The recess 11a is filled with a connector pin 13a of the connector portion 13, a connection terminal 23 of the sensor support 20, and a filler 50 covering these connection portions. For example, the recess 11a is filled with a liquid or gel epoxy resin, or the like having an excellent electrical insulating property and then cured, whereby the filler 50 fixes the sensor support 20 and the cover 40 to the recess 11a.

The pressure introduction pipe 12 of the exterior case 10 is formed in a tubular shape having one end connected to an opening at a bottom of the main body 11 and the other end opened. The end on the opposite side of the end of the pressure introduction pipe 12 connected to the main body 11 has a tapered enlarged-diameter portion 12a on an outer circumference, and is connected to, for example, an intake pipe or an exhaust pipe of the internal combustion engine via a tube or a connector. The pressure introduction pipe 12 introduces the gas A to be measured, which is a measurement target of the pressure sensor 1, into the opening of the main body 11.

For example, the connector portion 13 of the exterior case 10 extends in a direction of an axis L2 perpendicular to the direction of the axis L1 of the pressure introduction pipe 12 and the main body 11, and has one end connected to a side portion of the main body 11 and the other end having a substantially cylindrical shape with a protrusion on an outer circumference thereof. The connector portion 13 is connected to a connector portion of a wiring connected to, for example, an engine control unit (ECU) (not illustrated), and outputs an output signal of the sensor chip 30 to the ECU via a plurality of the connector pins 13a extending from the end on the main body 11 side to the inner side of the cylindrical end.

The connector pin 13a is provided integrally with the exterior case 10 by, for example, insert-molding. The connector pin 13a extends in the direction of the axis L2 of the connector portion 13, and has one end extending in the direction of the axis L1 of the main body 11 and embedded in the main body 11 and the other end protruding in the direction of the axis L2 at the inner side of the cylindrical end of the connector portion 13 and being inserted into, for example, a pin hole of the connector portion of the wiring connected to the ECU. For example, the connection terminal 23 provided on the sensor support 20 is connected to the end of the connector pin 13a on the main body 11 side.

The sensor support 20 is manufactured, for example, by molding with a mold using the same resin material as the exterior case 10 as a material. The sensor support 20 is formed, for example, in a discoid shape or a cylindrical shape, and has a protruding portion 24 protruding in a radial direction from an outer circumferential surface and extending along the outer circumferential surface. In the pressure sensor 1 of the present embodiment, the sensor support 20 includes: the support surface 21 which supports the sensor chip 30; a back surface 22 opposite to the support surface 21; the connection terminal 23 insert-molded in the sensor support 20; the recess 25 provided in the support surface 21; and a gas passage 26 passing through the sensor support 20.

The recess 25 provided in the support surface 21 of the sensor support 20 includes: a protective member accommodating recess 25a that accommodates the protective member 31 covering the sensor chip 30; and a sensor accommodating recess 25b provided at the bottom of the protective member accommodating recess 25a to accommodate the sensor chip 30 and a glass pedestal 32. The sensor chip 30 and the glass pedestal 32 are accommodated in the sensor accommodating recess 25b.

The sensor chip 30 is a semiconductor sensor made of, for example, silicon, and has a sensing unit that converts the pressure of the gas A to be measured into an electric signal. For example, the sensing unit can include a piezoelectric element or a strain gauge fixed to a diaphragm which is elastically deformed by the pressure of the gas A to be measured to form a bridge circuit.

The sensor chip 30 is bonded to the glass pedestal 32 by, for example, anodic bonding such that the diaphragm of the sensing unit closes the recess provided in the glass pedestal 32. The glass pedestal 32 is fixed to the bottom of the sensor accommodating recess 25b provided in the support surface 21 of the sensor support 20, for example, via an adhesive. The sensor chip 30 is supported on the support surface 21 of the sensor support 20 by being fixed to the bottom of the sensor accommodating recess 25b via the glass pedestal 32.

The protective member accommodating recess 25a is filled with the protective member 31 so as to cover the sensor chip 30, the glass pedestal 32, the wire 33, the connection terminal 23, and the connecting portions thereof. The sensor chip 30 or the like is protected from corrosive gas and liquid which is likely to be contained in the gas A to be measured by the protective member 31 covering the sensor chip 30 or the like, thereby improving the insulating property and corrosion resistance of each portion covered with the protective member 31.

As the protective member 31, for example, a polymer material having excellent electrical insulating property and chemical resistance can be used. As the polymer material, for example, silicone gel, fluorine gel, or the like can be used. For example, after fixing the sensor chip 30 to the sensor accommodating recess 25b via the glass pedestal 32, the protective member 31 can be formed so as to cover the sensor chip 30 and the like by injecting and a gel or liquid potting material into the protective member accommodating recess 25a and curing the resultant.

The gas passage 26 penetrates the sensor support 20 from the support surface 21 to the back surface 22, and communicates the pressure measurement chamber C1 facing the support, surface 21 of the sensor support 20 and a heat insulation chamber C2 facing the back surface 22 opposite to the support surface 21 of the sensor support 20. Although the single gas passage 26 is provided in the sensor support 20 in the example illustrated in FIG. 1, it is also possible to provide a plurality of the gas passages 26 in the sensor support 20. The gas passage 26 can be provided, for example, in parallel to the direction of the axis L1 of the sensor support 20.

The connection terminal 23 is, for example, a terminal made of phosphor bronze plated with nickel, is insert-molded on the sensor support 20, and extends in the radial direction of the sensor support 20 from the bottom of the protective member accommodating recess 25a to the outer side of the outer circumferential surface of the sensor support 20. A proximal end of the connection terminal 23 is exposed at the bottom of the protective member accommodating recess 25a, and a distal end thereof protrudes in the radial direction from the protruding portion 24 on the outer circumferential surface of the sensor support 20 and is electrically connected to the connector pin 13a of the connector portion 13. The connection terminal 23 is connected to the sensor chip 30 via the wire 33 formed by wire bonding using, for example, aluminum or gold as a material. The sensor chip 30, the connection terminal 23, the wire 33, and the connecting portions thereof are covered with the protective member 31.

The cover 40 is a lid-like or cap-like member that covers the back surface 22 opposite to the support surface 21 of the sensor support 20, and is a flat cylindrical member having a flat discoid upper wall 41 and a side wall 42 that hangs downward from a peripheral edge of the upper wall 41 along the direction of the axis L1 of the sensor support 20. A lower end of the side wall 42 of the cover 40 is supported by the protruding portion 24 of the sensor support 20 and is bent to the outer side in the radial direction of the cover 40. The cover 40 defines the heat insulation chamber C2 facing the back surface 22 of the sensor support 20. As the filler 50 filled in the recess 11a of the exterior case 10 provided around the cover 40 is cured, the cover 40 is fixed to the exterior case 10 by the filler 50, and fixes the sensor support 20 to the recess 11a of the exterior case 10 together with the filler 50.

Hereinafter, functions of the pressure sensor 1 of the present embodiment will be described. As described above, the pressure sensor 1 of the present embodiment is used to measure the gas A to be measured such as intake air and exhaust gas of the internal combustion engine. In the pressure sensor 1, the pressure introduction pipe 12 provided in the exterior case 10 is connected to an intake pipe and an exhaust pipe via a tube and a connector, and the connector portion 13 provided in the exterior case 10 is connected to the connector portion 13 of the wiring connected to the ECU. The gas A to be measured such as intake air and an exhaust gas is introduced into the pressure measurement chamber C1 of the main body 11 of the exterior case 10 via the pressure introduction pipe 12 of the exterior case 10.

The diaphragm of the sensing unit of the sensor chip 30 facing the pressure measurement chamber C1 is deformed due to the pressure of the gas A to be measured, which has been introduced into the pressure measurement chamber C1, and the electric signal in accordance with to the pressure of the gas A to be measured is output from the sensing unit. An output of the sensing section of the sensor chip 30 is output to the connector pin 13a of the connector portion 13 of the exterior case 10 via the wire 33 and the connection terminal 23, and is input to the ECU via the connector portion of the wiring connected to the ECU. As a result, the pressure of the gas A to be measured based on the output of the pressure sensor 1 is measured by the ECU.

The cover 40 of the pressure sensor 1 or the exterior case 10 is cooled by outside air taken in, for example, during traveling of a vehicle, and tends to become a temperature lower than a temperature of the gas A to be measured. In particular, when the vehicle performs high-speed traveling, and then, temporarily stops, and performs high-speed traveling again, the cooling function by the outside air increases in a state where the temperature of the gas A to be measured increases, and a temperature difference between the cover 40 of the pressure sensor 1 or the exterior case 10 and the gas A to be measured is likely to be large. In addition, during regeneration of a diesel particulate filter (DPF), the temperature of the gas A to be measured becomes higher than the temperature of the outside air, the temperature difference between the cover 40 of the pressure sensor 1 or the exterior case 10 and the gas A to be measured is likely to be large.

In addition, when a polymer material is used as the protective member 31 covering the sensor chip 30 or the like, a liquid contained in the gas A to be measured can be blocked by the protective member 31, but the polymer material has a property of permeating water vapor. Thus, the water vapor contained in the gas A to be measured tends to be turned into a state of permeating the protective member 31.

Figure 5:
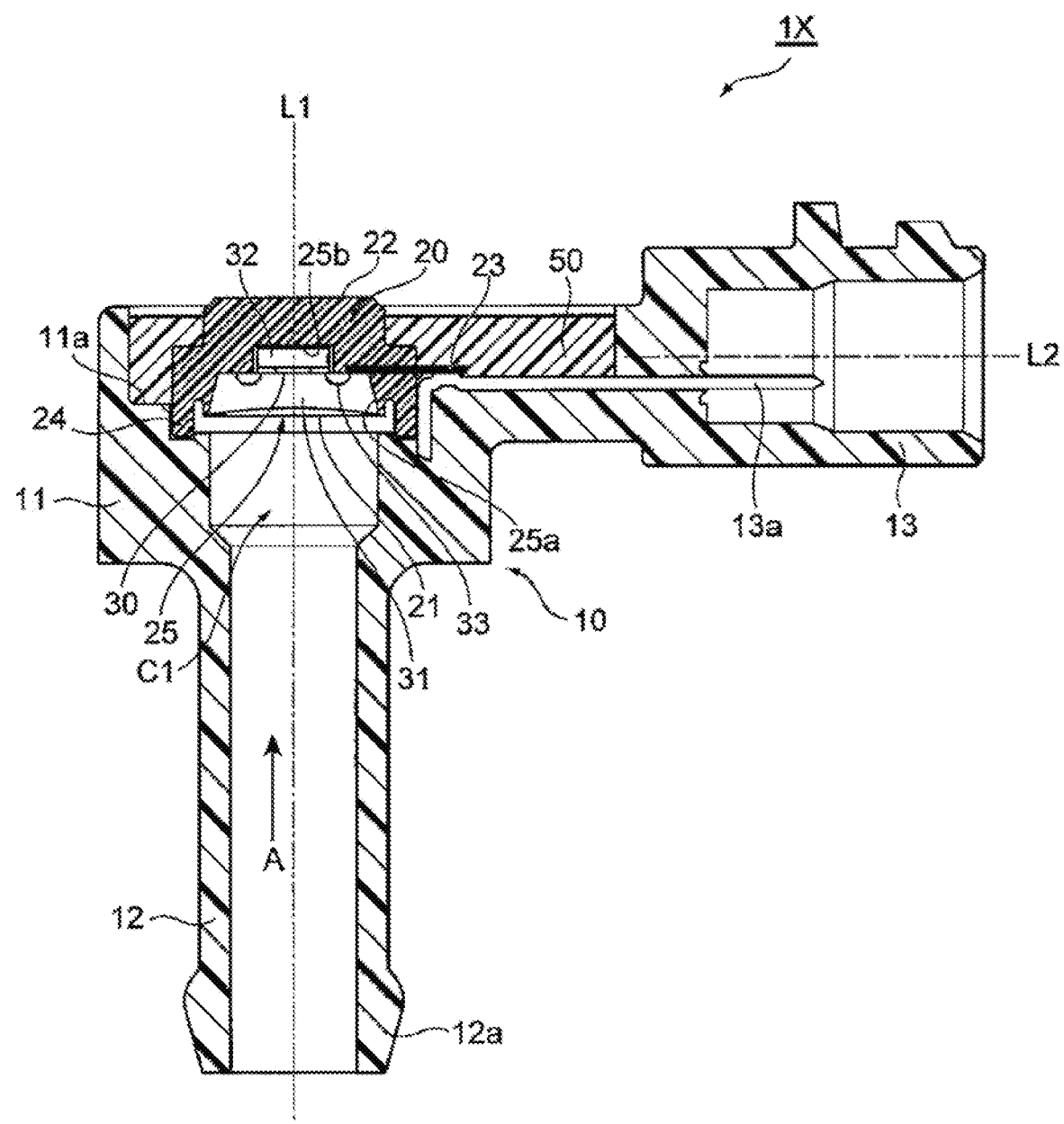
FIG. 5 is a cross-sectional view of a pressure sensor according to a comparative example to the embodiment of the present invention.

FIG. 5 is a cross-sectional view of a pressure sensor 1X of a comparative example with respect to the pressure sensor 1 of the present embodiment illustrated in FIG. 1.

The pressure sensor 1X of the comparative example illustrated in FIG. 5 does not have the cover 40, the heat insulation chamber C2 defined by the cover 40, and the gas passage 26 communicating the heat insulation chamber C2 and the pressure measurement chamber C1, which is different from the pressure sensor 1 of the present embodiment illustrated in FIG. 1. Other configurations of the pressure sensor 1X of the comparative example illustrated in FIG. 5 are the same as those of the pressure sensor 1 of the present embodiment illustrated in FIG. 1, and thus, the same parts will be denoted by the same reference signs and the description thereof is omitted.

The pressure sensor 1X of the comparative example illustrated in FIG. 5 has a structure in which the back surface 22 of the sensor support 20 is exposed to the outside, and the sensor support 20 is easily cooled by outside air. Thus, if the cooling effect of the back surface 22 of the sensor support 20 according to the outside air increases or the temperature difference between the outside air and the gas A to be measured increases as described above, the temperature of the sensor support 20 becomes lower than the temperature of the gas A to be measured, and further, may be lower than the dew point of the gas A to be measured in some cases. When the temperature of the sensor support 20 decreases, the temperature of the protective member 31 covering the sensor chip 30 and the like of the support surface 21 also decreases in the same manner For example, when the temperature of the protective member 31 becomes significantly lower than the temperature of the gas A to be measured, for example, to fall below the dew point of the gas A to be measured in a state where water vapor permeates the protective member 31, condensation of water vapor permeating the protective member 31 causes electrolytic corrosion in the sensor chip 30, the wire 33, the connection terminal 23, and the connecting portion thereof covered with the protective member 31, which may result in malfunctioning or disconnection at the time of pressure measurement. In addition, if the temperature of the protective member 31 further drops below a freezing point depending on conditions such as the outside air temperature, there is a risk that moisture condensed inside the protective member 31 may freeze.

Here, the pressure sensor 1 of the present embodiment is common to the pressure sensor 1X of the comparative example illustrated in FIG. 5 in terms of including: the pressure measurement chamber C1 into which the gas A to be measured is introduced; the sensor chip 30 which faces the pressure measurement chamber C1; the sensor support 20 which has the support surface 21 supporting the sensor chip 30; and the protective member 31 which covers the sensor chip 30. Furthermore, in addition to the configuration common to the pressure sensor 1X of this comparative example, the pressure sensor 1 of the present embodiment further includes the heat insulation chamber C2 facing the back surface 22 opposite to the support surface 21 of the sensor support 20, and the gas passage 26 communicating the heat insulation chamber C2 and the pressure measurement chamber C1.

Thus, the gas A to be measured, which has been introduced into the pressure measurement chamber C1 via the pressure introduction pipe 12, is introduced into the heat insulation chamber C2 by the gas passage 26 communicating the heat insulation chamber C2 facing the back surface 22 of the sensor support 20 and the pressure measurement chamber C1 facing the support surface 21 of the sensor support 20. The gas A to be measured, which has been introduced into the heat insulation chamber C2 keeps the back surface 22 of the sensor support 20 warm. That is, the sensor support 20 is kept warm or warmed by the gas A to be measured, which has been introduced into both of the pressure measurement chamber C1 facing the support surface 21 and the heat insulation chamber C2 facing the back surface 22 as both sides of the support surface 21 and the back surface 22 are covered with the gas A to be measured.

As a result, even if the cooling effect of the cover 40 and the exterior case 10 according to the outside air increases, or the temperature difference between the outside air and the gas A to be measured increases as described above, it is possible to suppress the temperature of the sensor support 20 from being lower than the dew point of the gas A to be measured or greatly lower than the temperature of the gas A to be measured. Therefore, it is possible to suppress water vapor permeating the protective member 31 from the gas A to be measured from being condensed around the sensor chip 30, and to prevent the freezing of moisture inside the protective member 31.

In the pressure sensor 1 of the present embodiment, the gas passage 26 that communicates the pressure measurement chamber C1 and the heat insulation chamber C2 is provided in the sensor support 20. Therefore, it is possible to form the gas passage 26 with hardly changing the design of the exterior case 10.

In addition, the pressure sensor 1 of the present embodiment includes the pressure introduction pipe 12 introducing the gas A to be measured, and the pressure introduction pipe 12 is connected to the pressure measurement chamber C1. As a result, it is possible to reduce a pressure loss of the gas A to be measured which is introduced into the pressure measurement chamber C1 and to measure the pressure of the gas A to be measured with higher accuracy.

In addition, in the pressure sensor 1 of the present embodiment, the sensor chip 30 is connected to the connection terminal 23, which forms an output terminal together with the connector pin 13a, via the wire 33, and the protective member 31 covers the wire 33. Such a wire 33 is likely to be affected by condensation when the temperature of the protective member 31 decreases. However, according to the pressure sensor 1 of the present embodiment, it is possible to suppress the condensation on the wire 33 by suppressing the temperature decrease of the protective member 31.

In addition, the material of the protective member 31 is the polymer material in the pressure sensor 1 of the present embodiment. Thus, the water vapor contained in the gas A to be measured permeates the protective member 31, but it is possible to prevent the condensation of the water vapor permeating the protective member 31 by suppressing the temperature decrease of the protective member 31 and to prevent the freezing of moisture condensed in the protective member 31 according to the pressure sensor 1 of the present embodiment.

As described above, according to the pressure sensor 1 of the present embodiment, it is possible to suppress the water vapor permeating the protective member 31 from the gas A to be measured from being condensed around the sensor chip 30 using the sensor chip 30 as a pressure measurement element, and to prevent trouble and disconnection at the time of pressure measurement.

Second Embodiment

Figure 2:
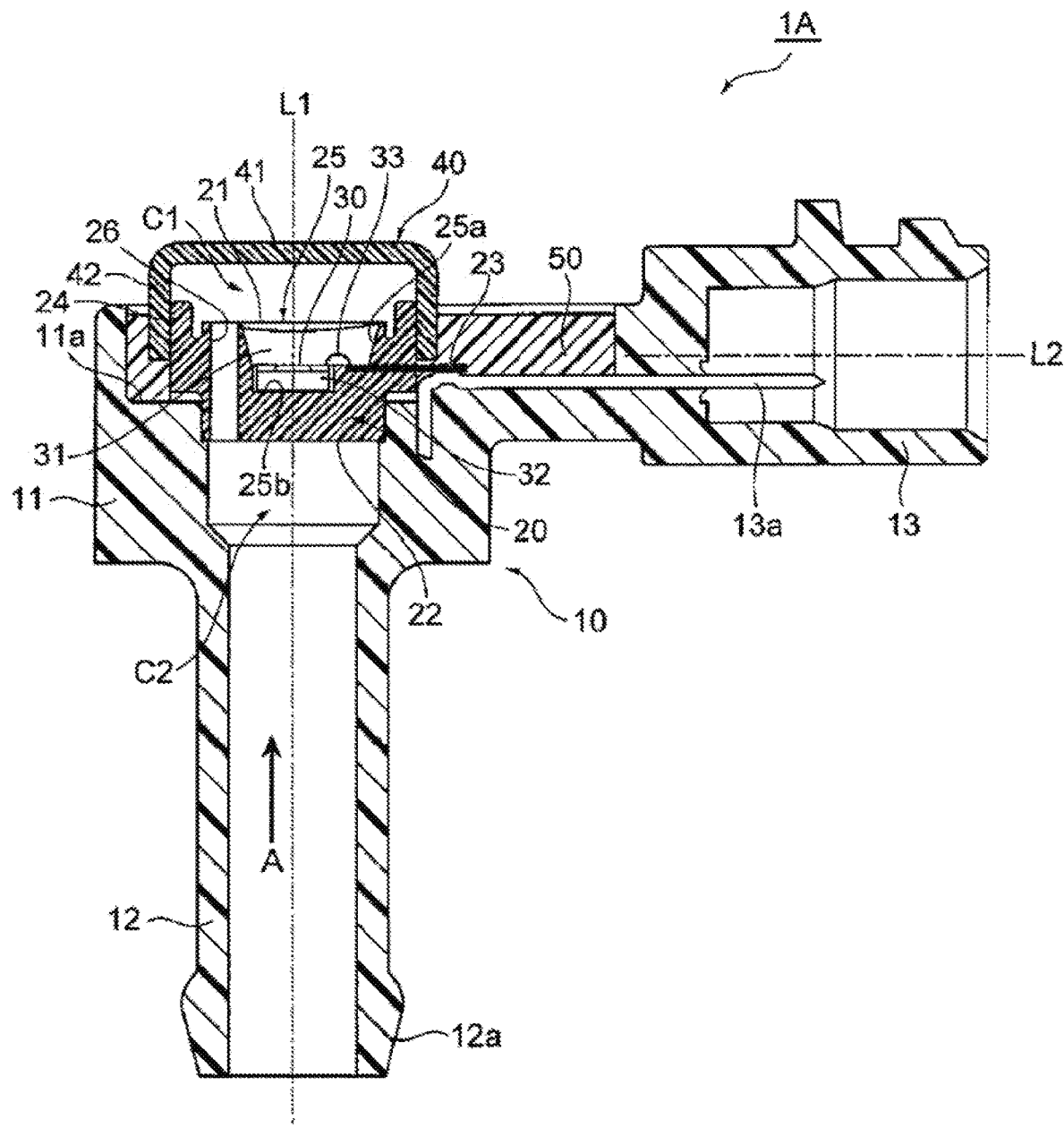
FIG. 2 is a cross-sectional view of a pressure sensor according to a second embodiment of the present invention.

FIG. 2 is a cross-sectional view of a pressure sensor 1A according to a second embodiment of the present invention.

The pressure sensor 1A of the present embodiment is different from the pressure sensor 1 of the first embodiment illustrated in FIG. 1 in terms that the sensor support 20 is reversed in the direction of the axis L1, the heat insulation chamber C2 is defined by the main body 11 of the exterior case 10, and the pressure measurement chamber C1 is defined by the cover 40. Other configurations of the pressure sensor 1A of the present embodiment are the same as those of the pressure sensor 1 of the first embodiment illustrated in FIG. 1, and thus, the same parts will be denoted by the same reference signs and the description thereof is omitted.

The pressure sensor 1A of the present embodiment includes the pressure introduction pipe 12 which introduces the gas A to be measured, and the pressure introduction pipe 12 is connected to the heat insulation chamber C2 defined by the main body 11 of the exterior case 10. Thus, the gas A to be measured, which has been introduced into the main body 11 of the exterior case 10 via the pressure introduction pipe 12, is first introduced into the heat insulation chamber C2 defined by the main body 11, and thereafter, is introduced into the pressure measurement chamber C1 defined by the cover 40 via the gas passage 26 provided in the sensor support 20. As a result, moisture, foreign matters, and the like contained in the gas A to be measured are prevented from adhering to the protective member 31 that covers the sensor chip 30, and the durability of the pressure sensor 1A is improved.

In addition, the pressure sensor 1A of the present embodiment is warmed or kept warm by the gas A to be measured, which has been introduced into the pressure measurement chamber C1 and the heat insulation chamber C2, as both sides of the support surface 21 and the back surface 22 of the sensor support 20 are covered with the gas A to be measured, which is similar to the pressure sensor 1 of the first embodiment described above. Therefore, it is possible to obtain the same effect as the pressure sensor 1 of the first embodiment according to the pressure sensor 1A of the present embodiment.

Third Embodiment

Figure 3:
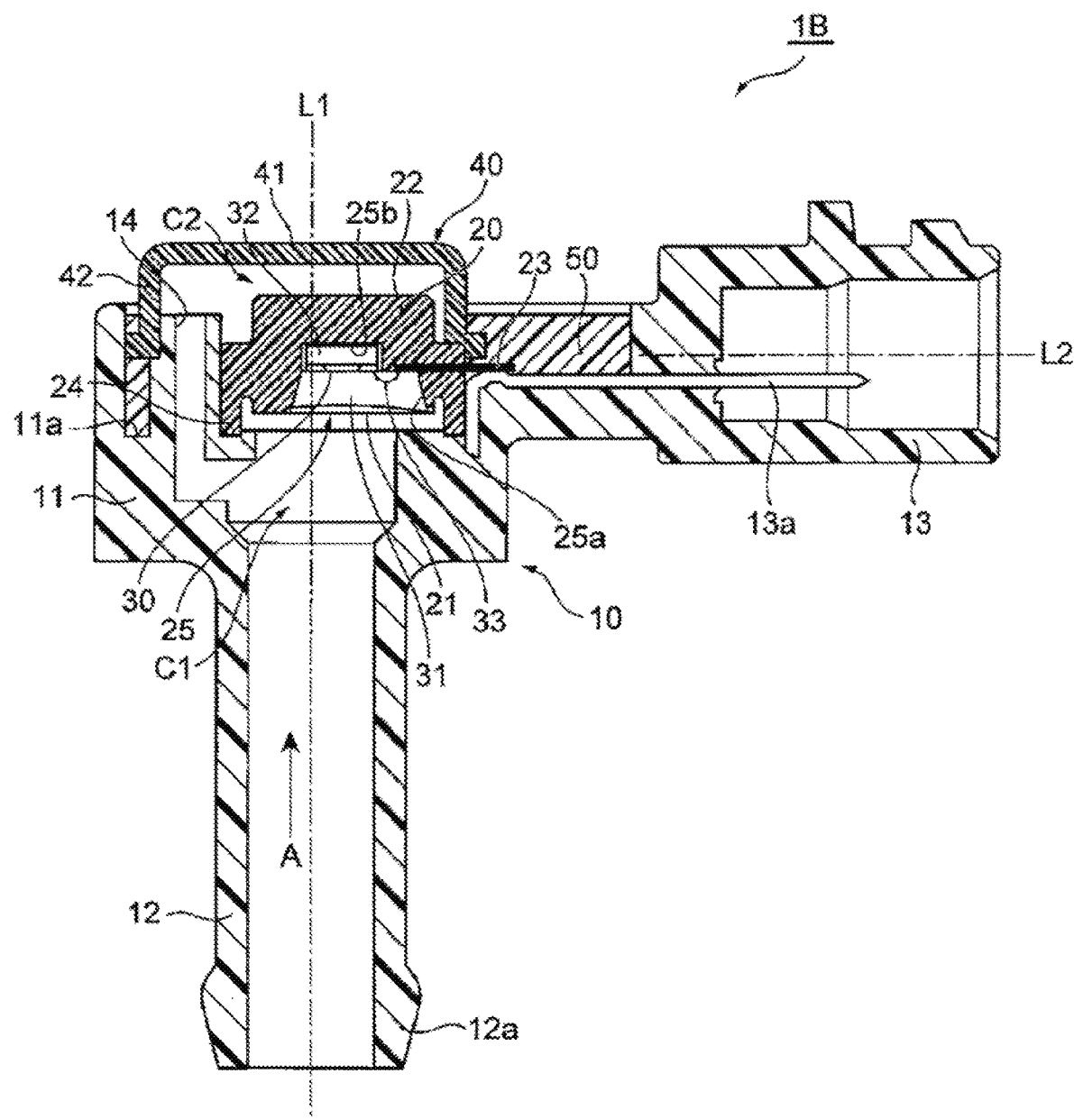
FIG. 3 is a cross-sectional view of a pressure sensor according to a third embodiment of the present invention.

FIG. 3 is a cross-sectional view of a pressure sensor 1B according to a third embodiment of the present invention.

The pressure sensor 1B of the present embodiment is different from the pressure sensor 1 of the first embodiment illustrated in FIG. 1 in terms that the gas passage 14 is provided in the exterior case 10. Other configurations of the pressure sensor 1B of the present embodiment are the same as those of the pressure sensor 1 of the first embodiment illustrated in FIG. 1, and thus, the same parts will be denoted by the same reference signs and the description thereof is omitted.

The pressure sensor 1B according to the present embodiment includes the exterior case 10 that supports the sensor support 20, and the gas passage 14 that communicates the pressure measurement chamber C1 and the heat insulation chamber C2 is provided in the exterior case 10. As a result, it is possible to form the gas passage 14 in the pressure sensor 1B with hardly changing the design of the sensor support 20.

In addition, both sides of the support surface 21 and the back surface 22 of the sensor support 20 are covered with the gas A to be measured, and are warmed or kept warm by the gas A to be measured, which has been introduced into the pressure measurement chamber C1 and the heat insulation chamber C2 in the pressure sensor 1B of the present embodiment, which is similar to the pressure sensor 1 of the first embodiment described above. Therefore, it is possible to obtain the same effect as the pressure sensor 1 of the first embodiment according to the pressure sensor 1B of the present embodiment.

Fourth Embodiment

Figure 4:
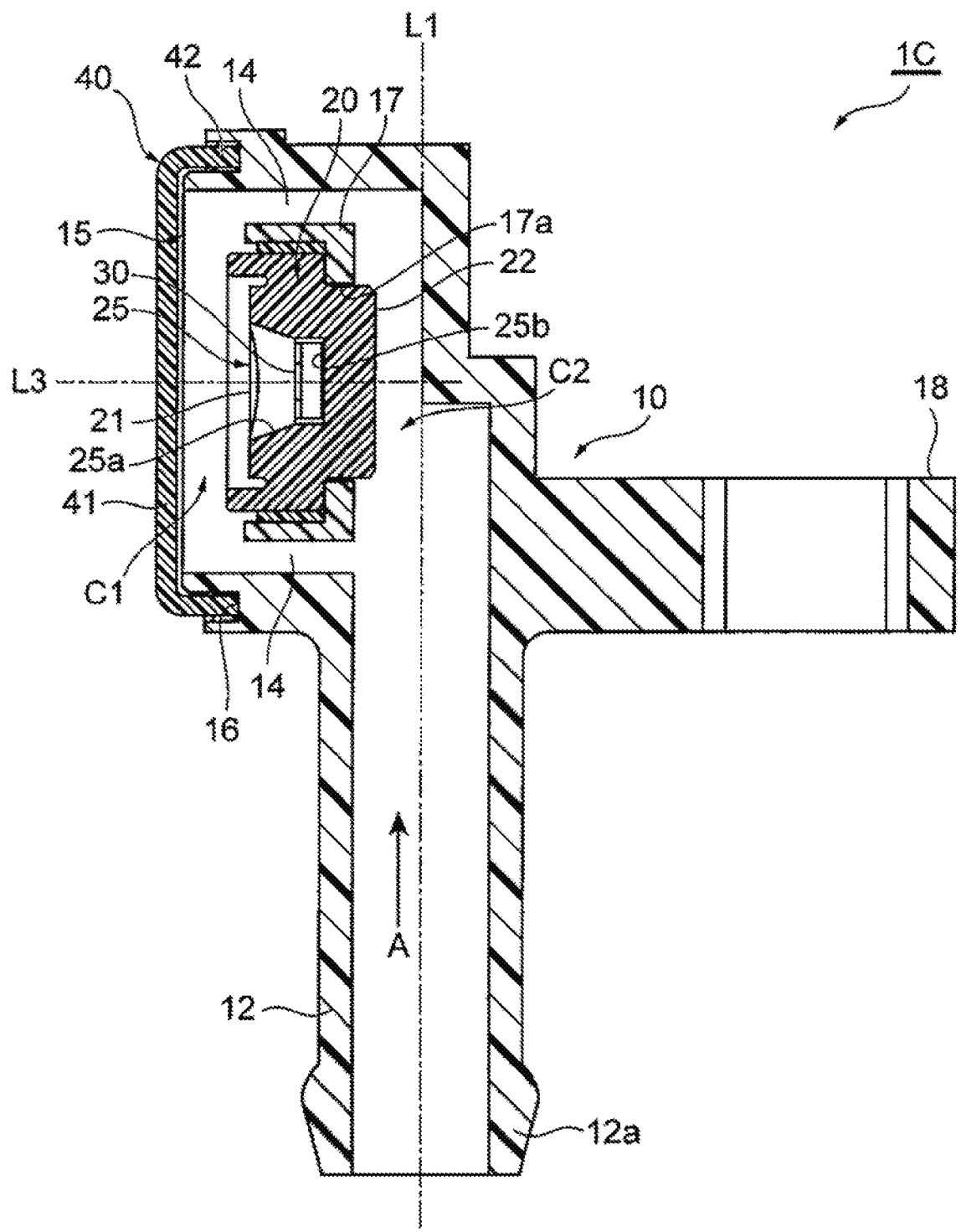
FIG. 4 is a cross-sectional view of a pressure sensor according to a fourth embodiment of the present invention.

FIG. 4 is a cross-sectional view of a pressure sensor 1C according to a fourth embodiment of the present invention.

The pressure sensor 1C of the present embodiment is different from the pressure sensor 1B of the second embodiment illustrated in FIG. 2 mainly in terms that the sensor support 20 is supported by the exterior case 10 such that a direction of an axis L3 of the sensor support 20 is perpendicular to the direction of the axis L1 of the pressure introduction pipe 12 and the gas passage 14 is provided in the exterior case 10. Other configurations of the pressure sensor 1C of the present embodiment are the same as those of the pressure sensor 1B of the second embodiment illustrated in FIG. 2, and thus, the same parts will be denoted by the same reference signs and the description thereof is omitted.

In the pressure sensor 1C of the present embodiment, the main body 11 of the exterior case 10 has an opening 15 in a side portion, and has a groove portion 16 which fits the end portion of the side wall 42 of the cover 40 to the periphery of the opening 15. The cover 40 is fixed to the exterior case 10 by fitting the end portion of the side wall 42 to the groove 16 of the exterior case 10 filled with, for example, an epoxy resin and curing the epoxy resin, and closes the opening 15 in the side portion of the main body 11 and defines the pressure measurement chamber C1 inside the opening 15 in the side portion of the main body 11.

A support portion 17, which supports the sensor support 20 on the exterior case 10 is provided inside the opening 15 of the main body 11 of the exterior case 10 in such a manner that the direction of the axis L3 of the sensor support 20 is perpendicular to the direction of the axis L1 of the pressure introduction pipe 12. The support portion 17 has an opening 17a which exposes the back surface 22 of the sensor support 20 in the heat insulation chamber C2 defined by the exterior case 10 and the gas passage 14 which communicates the heat insulation chamber C2 and the pressure measurement chamber C1.

In addition, the connector portion 13, not illustrated in FIG. 4, is provided in a direction perpendicular to the direction of the axis L3 of the sensor support 20 and the direction of the axis L1 of the pressure introduction pipe 12. In addition, a flange 18 is provided on the main body 11 of the exterior case 10 so as to protrude in a direction parallel to the axis L3 direction of the sensor support 20 and perpendicular to the direction of the axis L1 of the pressure introduction pipe 12.

In the pressure sensor 1C according to the present embodiment, the pressure introduction pipe 12 is connected to the heat insulation chamber C2 defined by the main body 11 in parallel with the back surface 22 of the sensor support 20. As a result, it is possible to prevent moisture and foreign matters contained in the gas A to be measured from colliding with the back surface 22 of the sensor support 20, thereby further improving the durability of the pressure sensor 1C.

In addition, in the pressure sensor 1C of the present embodiment, both the support surface 21 and the back surface 22 of the sensor support 20 are covered and warmed or kept warm by the gas A to be measured introduced into the heat insulation chamber C2 via the pressure introduction pipe 12 and the gas A to be measured introduced from the heat insulation chamber C2 into the pressure measurement chamber C1 via the gas passage 14, which is similar to the pressure sensor 1B of the second embodiment. Therefore, it is possible to obtain the same effect as the pressure sensor 1B of the second embodiment according to the pressure sensor 1C of the present embodiment.

Although the embodiment of the present invention has been described in detail with reference to the drawings as above, a specific configuration is not limited to the embodiment, and design alterations or the like made in a scope not departing from a gist of the present invention is included in the present invention.

REFERENCE SIGNS LIST

1, 1A, 1B, 1C pressure sensor
10 exterior case
12 pressure introduction pipe
14 gas passage
20 sensor support member
21 support surface
22 back surface
23 connection terminal (output terminal)
26 gas passage
30 sensor chip
31 protective member
33 wire
A gas to be measured
C1 pressure measurement chamber
C2 heat insulation chamber

The invention claimed is:

1. A pressure sensor including a pressure measurement chamber into which a gas to be measured is introduced, a sensor chip which faces the pressure measurement chamber, a sensor support which has a support surface supporting the sensor chip, and a protective member which covers the sensor chip, the pressure sensor comprising:

a cover which covers a back surface opposite to the support surface of the sensor support;

a heat insulation chamber which faces the back surface and which is defined between the cover and the back surface; and a gas passage which communicates the heat insulation chamber and the pressure measurement chamber.

2. The pressure sensor according to claim 1, wherein the gas passage is provided in the sensor support.

3. The pressure sensor according to claim 1, further comprising an exterior case which supports the sensor support, wherein the gas passage is provided in the exterior case.

4. The pressure sensor according to claim 1, further comprising a pressure introduction pipe which introduces the gas to be measured, wherein the pressure introduction pipe is connected to the pressure measurement chamber.

5. The pressure sensor according to claim 1, wherein the sensor chip is connected to an output terminal via a wire, and the protective member covers the wire.

6. The pressure sensor according to claim 1, wherein a material of the protective member is a polymer material.

* * * * *